(12) United States Patent
Sakai et al.

(10) Patent No.: US 9,030,834 B2
(45) Date of Patent: May 12, 2015

(54) MOUNTING STRUCTURE OF FLEXIBLE PRINTED CIRCUIT BOARD AND SLIDING-TYPE ELECTRONIC DEVICE

(75) Inventors: Takahiro Sakai, Tokyo (JP); Toshiki Yamanaka, Shizuoka (JP); Hiroshi Yamada, Shizuoka (JP)

(73) Assignee: NEC Corporation, Tokyo (JP)

( * ) Notice: Subject to any disclaimer, the term of this patent is extended or adjusted under 35 U.S.C. 154(b) by 962 days.

(21) Appl. No.: 13/130,449

(22) PCT Filed: Nov. 6, 2009

(86) PCT No.: PCT/JP2009/005934
§ 371 (c)(1),
(2), (4) Date: May 20, 2011

(87) PCT Pub. No.: WO2010/061540
PCT Pub. Date: Jun. 3, 2010

(65) Prior Publication Data
US 2011/0222248 A1    Sep. 15, 2011

(30) Foreign Application Priority Data
Nov. 25, 2008 (JP) .................................. 2008-299082

(51) Int. Cl.
*H05K 5/00* (2006.01)
*H05K 7/14* (2006.01)
*H04M 1/02* (2006.01)

(52) U.S. Cl.
CPC ........... *H05K 7/1461* (2013.01); *H04M 1/0237* (2013.01); *H04M 1/0274* (2013.01); *H04M 1/0277* (2013.01); *H05K 7/1417* (2013.01)

(58) Field of Classification Search
USPC ......... 361/727, 730, 741, 748, 752, 756, 749, 361/679.56; 455/575.1, 575.4
See application file for complete search history.

(56) References Cited

U.S. PATENT DOCUMENTS

| 6,947,778 | B2 | 9/2005 | Tsai |
| 6,961,593 | B1 | 11/2005 | Lonka et al. |
| 2005/0221873 | A1* | 10/2005 | Kameyama et al. ....... 455/575.4 |

FOREIGN PATENT DOCUMENTS

| EP | 0658030 A1 | 6/1995 |
| JP | 5284198 A | 10/1993 |

(Continued)

OTHER PUBLICATIONS

Office Action, dated Apr. 22, 2014, issued by the Japanese Patent Office, in counterpart Application No. 2013-019032.

(Continued)

*Primary Examiner* — Robert J Hoffberg
*Assistant Examiner* — Hung Dang
(74) *Attorney, Agent, or Firm* — Sughrue Mion, PLLC

(57) ABSTRACT

A mounting structure of a flexible printed circuit board and a sliding-type electronic device is provided by which a too large increase in thickness of devices can be avoided and a pair of housings can be slid relatively in a bending and slanting direction. In the mounting structure, an upper housing 12 and a lower housing 22 coupled in a freely slidable manner are electrically connected to each other by a flexible printed circuit board folded back to be routed between slide facing surfaces 12b and 22a of both the housings and the height of a side wall surface 12c and 22c of the upper housing and lower housing changes in a bending manner along the direction of freely sliding and, in the slide facing surfaces of the upper housing and lower housing, concave space portions 15 and 25 to accommodate the change in curvature and in position of a folding-back portion 31a caused by sliding motion between the upper housing and lower housing are disposed.

4 Claims, 10 Drawing Sheets

(56) References Cited

FOREIGN PATENT DOCUMENTS

| | | | |
|---|---|---|---|
| JP | 07-221823 | A | 8/1995 |
| JP | 09-247252 | A | 9/1997 |
| JP | 10-243065 | A | 9/1998 |
| JP | 11-331332 | A | 11/1999 |
| JP | 2003-110675 | A | 4/2003 |
| JP | 2004-222173 | A | 8/2004 |
| JP | 2005-084955 | A | 3/2005 |
| JP | 2006-115111 | A | 4/2006 |
| JP | 2006-157465 | A | 6/2006 |
| JP | 2009-295339 | A | 12/2009 |
| WO | 2006/095382 | A1 | 9/2006 |

OTHER PUBLICATIONS

Office Action dated Dec. 4, 2012 issued by the Japanese Patent Office in counterpart Japanese Patent Application No. 2008-299082.

Japanese Office Action issued Nov. 19, 2013 in corresponding Japanese Patent Application No. 2013-019032.

Office Action, dated Jul. 25, 2013, issued by the State Intellectual Property Office of the People's Republic of China, in counterpart Application No. 200980147225.7.

Extended European Search Report dated Mar. 7, 2014, issued by the European Patent Office in corresponding European Application No. 09828790.7.

* cited by examiner

MOUNTING STRUCTURE OF FLEXIBLE PRINTED CIRCUIT BOARD AND SLIDING-TYPE ELECTRONIC DEVICE

CROSS REFERENCE TO RELATED APPLICATION

This application is a National Stage of International Application No. PCT/JP2009/005934 filed Nov. 6, 2009, claiming priority based on Japanese Patent Application No. 2008-299082, filed Nov. 25, 2008, the contents of all of which are incorporated herein by reference in their entirety.

TECHNICAL FIELD

The present invention relates to a mounting structure of a flexible printed circuit board and a sliding-type electronic device and more particularly to the mounting structure of the flexible printed circuit board being able to house, in a compact manner, the flexible printed circuit board between slide facing surfaces of housings that slide in a direction relative to each other and the sliding-type electronic device.

In electronic devices being available recently, for example, some devices are configured so that a display section and an operation section are disposed in separate housings and a pair of housings is coupled in a freely slidable manner. In the sliding-type electronic devices, by making the operation section hidden on a rear side of the display section at time of not using the device and by making the operation section exposed so as to be operable for inputting at time of using the device, limitation of careless inputting operation and compactness of the devices are achieved.

In the sliding-type electronic device of this type, it is necessary that circuit boards mounted in the pair of sliding housings are electrically connected to each other by using a flexible printed circuit (FPC) board. The FPC board is configured, by setting its length to be longer than the minimum length required to connect between circuit boards of the both housings to form a folding-back portion (folding-back section), so as to follow the sliding motion relative to each other between housings without the occurrence of the breaks of the FPC board and to maintain a connection state (for example, Related Art Patent Reference 1).

Incidentally, there is a proposal that a structure in which a display portion and an operation portion are connected in a bending surface of the FPC board is to be applied to an electronic device having the display portion and operation portion, in particular, to a portable type electronic device such as a mobile phone (for example, Related Art Patent Reference 2). Moreover, in the mobile phone of the above type, by employing the structure in which the operation portion being connected to the display portion is opened or closed by the sliding of the cover, careless inputting operation can be limited.

RELATED ART DOCUMENT

Related Art Patent References

Related Art Patent Reference 1: WO2006/095382
Related Art Patent Reference 2: Japanese Patent Application Laid-open Hei9-247252

SUMMARY OF INVENTION

Problems to be Solved by the Invention

However, the sliding-type electronic device disclosed in the Related Art Patent Reference 1 has a problem in that areas occupied by internally mounted various components caused by miniaturization and thinning and functional increases tend to increase. Moreover, as shown in FIGS. 9 and 10, in the sliding-type electronic device 100 such as a mobile phone in which a housing 101 having a display portion 101a and a housing 102 having an operation portion (not shown) are coupled to each other in a freely sliding manner through a sliding mechanism, it is necessary to prepare a space 120 to mount an FPC board 110 between the pair of housings 101 and 102 so that the space 120 extends with a predetermined height H in a sliding direction. The sliding-type electronic device 100 has another problem in that, in order to achieve its miniaturization and thinning and to decrease a ratio of the height H of the mounting space 120 to a whole thickness T, if a bending radius of a folding-back portion of the FPC board 110 is made small (if curvature is made large), the durability of the FPC board 110 decreases due to sliding motion for opening and closing, resulting in a break of the FPC board 110.

On the other hand, the Related Art Patent Reference 2 discloses another mobile phone in which, if, by making the most of the posture relative to each other between a display portion and an operation portion, for example, the posture of a housing on the display portion side, which has slid over the housing on the operation side, is inclined in a direction of rising, useless space is provided. That is, since the facing surface that faces a side of a housing having circuit boards is bent, space for bending is required.

In other words, in the case of a mechanism in which a pair of housings is slid on each other in a bending direction, it is necessary to ensure sufficient space to mount the FPC board and to slide one housing over another housing, resulting in increased thickness on the whole.

In view of the above, an object of the present invention is to provide a mounting structure of the flexible printed circuit board and a sliding-type electronic device which is able to slide a pair of housings in a bending direction relative to each other without causing a large increase in thickness of a device.

Means for Solving the Problems

To solve the above problems, the configuration of the present invention is characterized in that a mounting structure of a flexible printed circuit board including a flexible printed circuit board routed between slide facing surfaces of a first housing and a second housing both being mechanically coupled to each other in a manner being freely slidable to electrically connect the first and second housings wherein a height making up a sidewall surface of at least one of the first and second housings changes along a freely slidable direction and a concave space portion on a slide facing surface making up at least one of the first and second housings to accommodate a flexible change in shape of the flexible printed circuit board caused by sliding motion between the first and second housings.

EFFECTS OF INVENTION

According to the configuration of the present invention, the flexible printed circuit board can flexibly change its shape depending on sliding motion in concave space portions disposed on slide facing surfaces of housings a height on a wall side of which changes. Therefore, it is not necessary to separately provide space in which the height of the side wall surface and space to accommodate a flexible change in shape caused by sliding motion of the flexible printed circuit board and thus miniaturization and thinning can be achieved without causing unnecessary increased thickness of a device.

BRIEF DESCRIPTION OF DRAWINGS

FIG. 4 is a drawing showing sliding motion of the mobile phone of the exemplary embodiment of the present invention and FIG. 4(a) is a side surface perspective view showing a state before the sliding motion and FIG. 4(b) is a side surface perspective view showing a state after the sliding motion.

FIG. 8 is a diagram explaining sliding motion of the mobile phone and FIG. 8(a) is a side perspective view showing a state before the sliding motion and FIG. 8(b) is a side perspective view showing a state after the sliding motion.

FIG. 10 is a diagram explaining sliding motion of the mobile phone and FIG. 10(a) is a side perspective view showing a state before the sliding motion and FIG. 10(b) is a side perspective view showing a state after the sliding motion.

BEST MODE OF CARRYING OUT THE INVENTION

A mounting structure of a flexible printed circuit board is provided in which a first housing and a second housing mechanically coupled each being freely slidable are electrically connected by a flexible printed circuit board folded back to be routed between sliding surfaces of the both housings facing each other, characterized in that a height of a side wall surface making up at least one of the first and second housings changes in a bending or slanting manner along the direction of free sliding and that a concave space portion is provided on the sliding surface making up at least one of the first and second housings to accommodate a flexible change in shape of a curvature of folding-back of the flexible printed circuit board and its folding-back position or the like caused by sliding motion of the first and second housings. Hereinafter, exemplary embodiments of the present invention are described in detail by referring to drawings.

First Exemplary Embodiment

Figure 1:
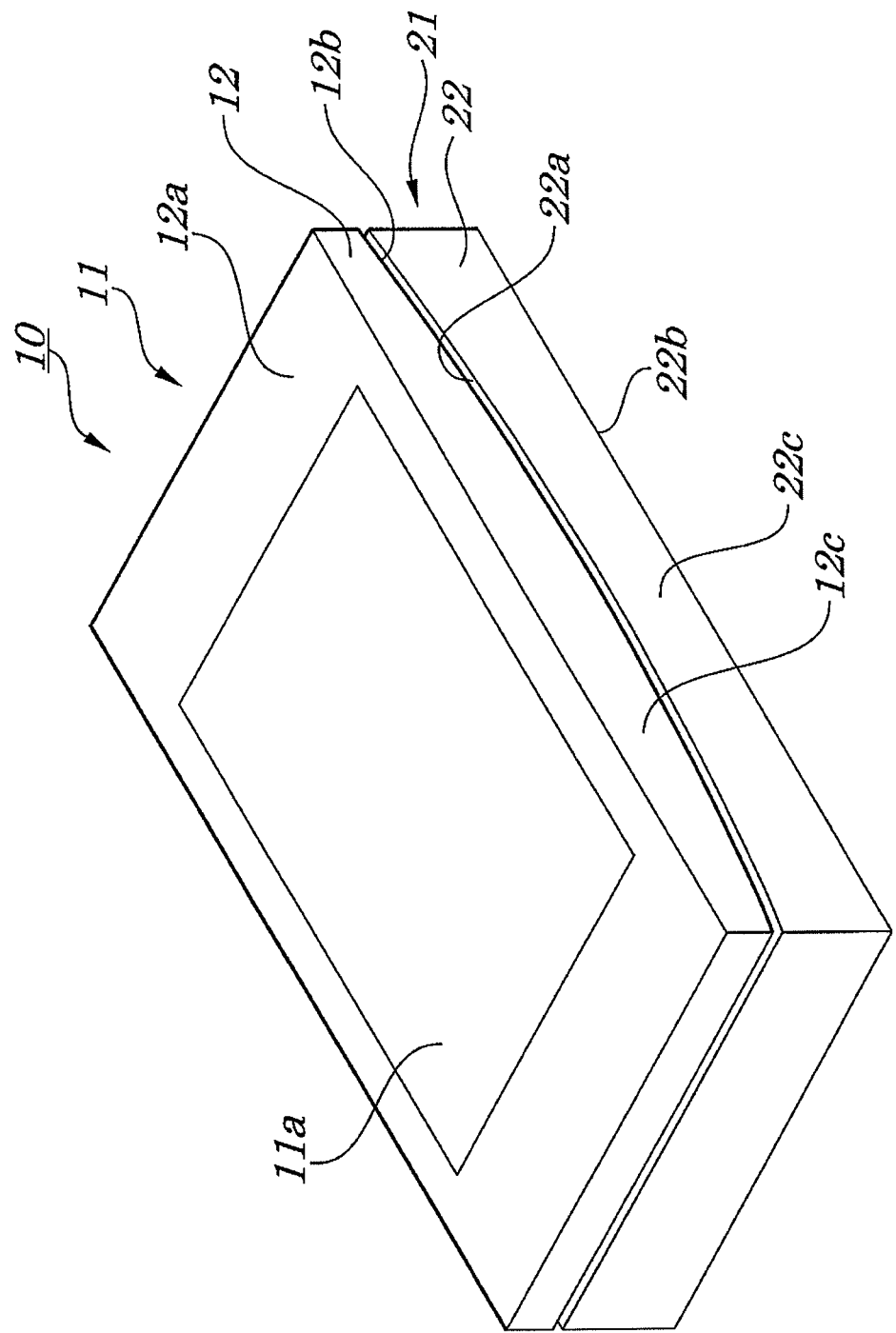
FIG. 1 is a perspective view showing a mobile phone being a portable type electronic device having a sliding mechanism of a first exemplary embodiment of the present invention.
Figure 2:
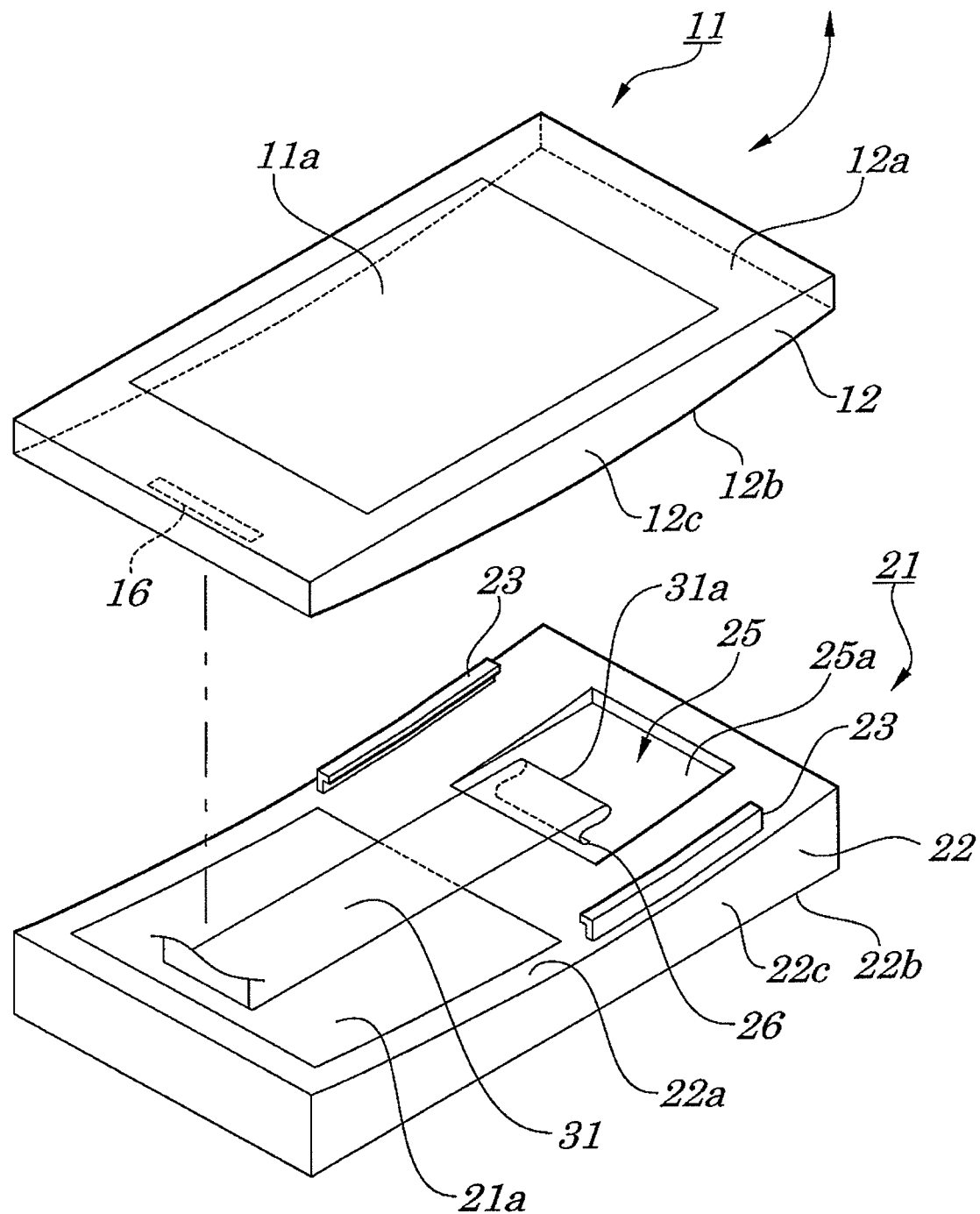
FIG. 2 is a separate perspective view showing the configuration of an upper housing and lower housing of the mobile phone of the first exemplary embodiment of the present invention.
Figure 3:
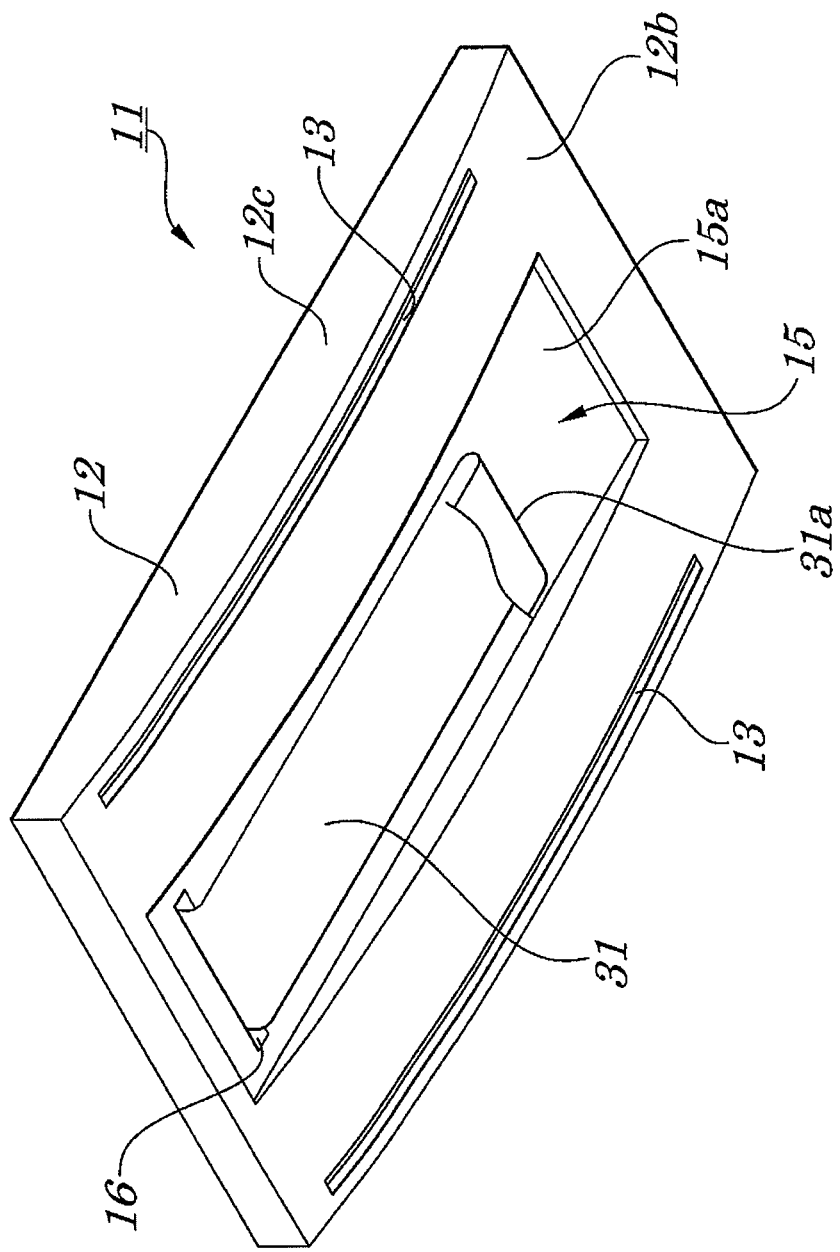
FIG. 3 is a perspective view showing the configuration of the upper housing of the mobile phone of the exemplary embodiment of the present invention.
Figure 4:
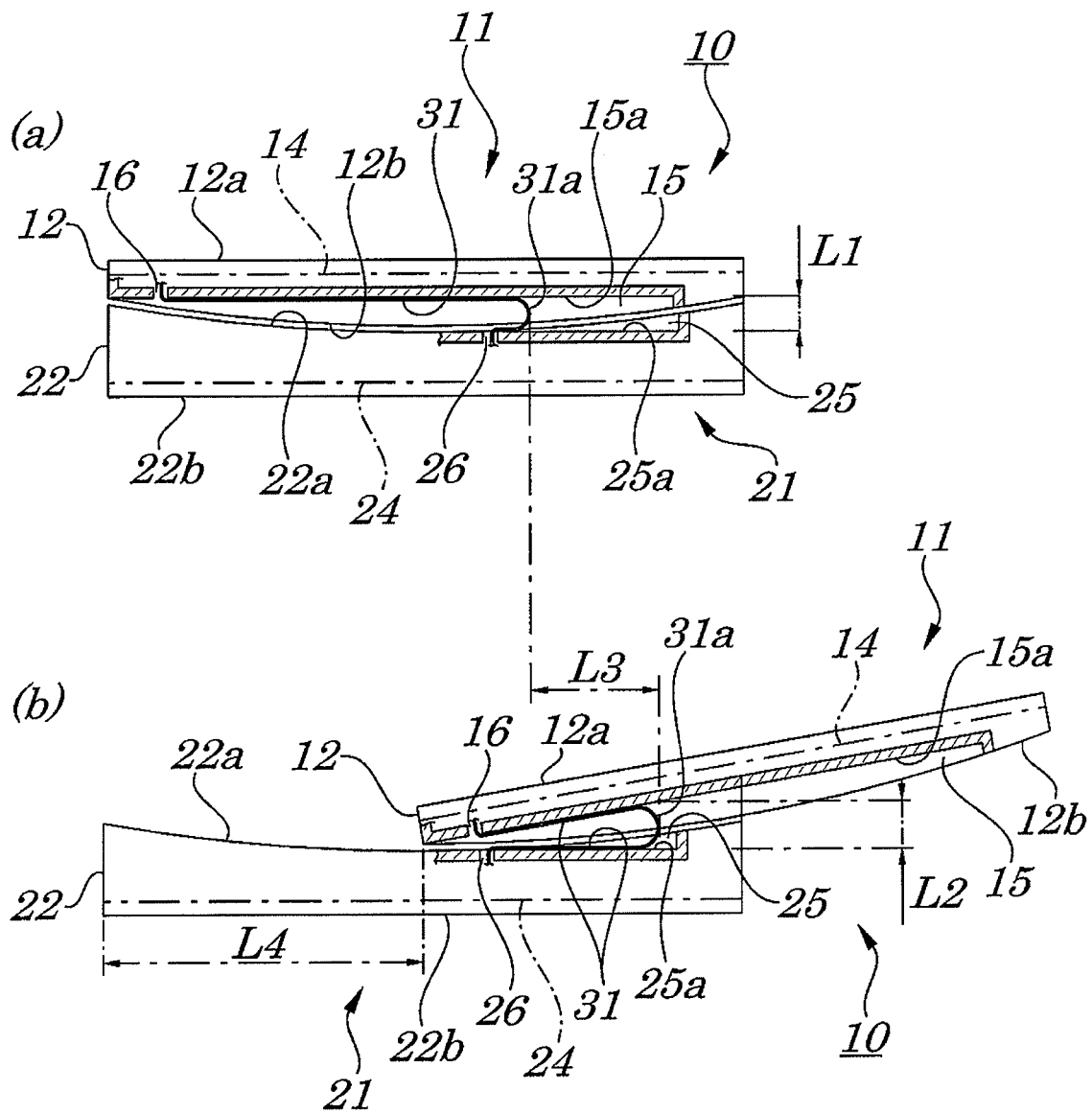

FIGS. 1 to 4 are diagrams respectively showing one example of a mobile phone to which a sliding-type electronic device having a mounting structure of a flexible printed circuit board of a first exemplary embodiment of the present invention is applied. FIG. 1 is a perspective view of an outward appearance of the mobile phone. FIG. 2 is a separate perspective view, as seen from an upper slanting direction, of a first housing and a second housing making up the portable phone. FIG. 3 is a separate perspective view, as seen from a lower slanting direction, of the first housing. FIG. 4 is a side transparent view showing the flexible printed circuit board to which a circuit board is connected during a sliding operation of the first and second housings.

As shown in FIG. 1, the mobile phone 10 is so configured that an upper unit 11 and a lower unit 21 are coupled by the flexible printed circuit board 31 (hereinafter, may be simply referred to as an FPC board) 31 which are shown in detail later in FIG. 2 and other and in a manner in which the upper and lower units 11 and 21 can overlie each other in the shape of thin rectangular parallelepiped. The mobile phone 10 is also configured so that the upper unit 11 faces the lower unit 21 and a lower surface 12b of the upper housing 12 of the upper unit 11 can be coupled to an upper surface 22a of the lower housing 22 of the lower unit 21 in a manner in which the lower surface 12b and upper surface 22a can be freely slid in a longitudinal direction with these two surfaces 12b and 22a facing each other. In the upper unit 11, a display portion 11a to display various information is disposed on approximately the whole upper surface 12a of the upper housing 12. In the lower unit 21, an operation section 21a to perform an operation to input various information is disposed (see FIG. 2) in a region on the upper surface 22a of the lower housing 22 that exposes after having slid the upper unit 11 (see FIG. 2). The mobile phone 10 is so configured as to relatively slide the upper unit 11 and lower unit 21 in a longitudinal direction to open or close the operation section 21a in an operable or inoperable manner and, by using a relative slide-open operation direction of the upper housing 12 and lower housing 22 as a reference, each of the configurations on a tip end side and on a rear end side is described (This can be applied to other exemplary embodiments described below).

In the upper unit 11, a height of the side surface (side wall portion) of the upper housing 12 changes in a bending manner in a direction in which the upper housing 12 freely slides (simply referred to as a sliding direction) and the lower surface 12b bends in a longitudinal direction of the rectangular parallelepiped and extrudes in a convex shape. Similarly, in the lower unit 21, a height of the side surface (side wall portion) of the lower housing 22 changes in a bending manner in a direction in which the lower housing 22 slides and the upper surface 22a bends in a longitudinal direction of the rectangular parallelepiped and is recessed in a concave shape. Each of cross-sections of the lower surface 12b and upper surface 22a is so formed as to be similar to each other and to face each other in a state coming near to each other. In the lower housing 22, as shown in FIG. 2, extruding rails 23 each having its cross-sectional shape of a key-shaped track are formed along both sides of the upper surface 22a in a longitudinal direction, which extends by a length being a half of a length of a longitudinal direction of the upper surface 22a. On the other hand, in the upper housing 12, as shown in FIG. 3, grooved rails 13 each having its cross-sectional shape of a key-shaped track are formed along both sides of the lower surface 12b and extend by a whole length of a longitudinal direction of the lower surface 12b. Cross-sectional shapes of the extruding rails 23 and cross-sectional shapes of grooved rails 13 are respectively formed so as to be similar to one another so that these rails 13 and 23 are fitted in an engaged state to be slidable and are coupled to one another.

In the mobile phone 10, by fitting the extruding rails 23 into the grooved rails 13, as shown in FIG. 4, the upper housing 12 and lower housing 22 are allowed to be relatively slid toward bent portions in the longitudinal direction of the rails 13 and 23 in a state being kept in which the lower surface 12b of the upper housing 12 comes near to the upper surface 22a of the lower housing 22. That is, the grooved rail 13 and extruding rail 23 make up a sliding mechanism and the lower surface 12b of the upper housing 12 and lower surface 22a of the lower housing 22 make up a slide facing surface. Then, by relatively sliding the upper unit 11 and lower unit 21, which have overlain each other, toward the "open" direction, the operation section 21a, which has remained hidden in a state facing the lower surface 12b of the upper housing 12, on the tip end side where there is no extruding rail 23 disposed on the upper surface 22a of the lower housing 22 is allowed to be exposed to perform inputting operations. At this time point, the lower surface 12b of the upper housing 12 bending in a convex shape is slid over the upper surface 22a of the lower housing 22 bending in a concave shape to allow the display portion 11a disposed on the side of the upper surface 12a to be put into operation. In other words, the display portion 11a is in a state being risen from the operation section 21a on the upper surface 22a side of the lower housing 22 and, therefore, a face angle at the display portion 11a facing a user can be made larger which can improve visibility, compared when the operation section 21a is positioned on a plane surface on which an operation surface of the operation section 21a is extended.

In the upper unit 11 and lower unit 21, as shown in FIGS. 2 and 3, the FPC board 31 being in a state folded back to be routed from a drawing-out port 16, in a shape of an aperture, formed in the lower surface 12b of the upper housing 12 and a drawing-out port 26, in a shape of an aperture, formed in the upper surface 22a of the lower housing 22 is inserted into an inner space between the upper housing 12 and lower housing 22 to supply electricity between circuit substrates 14 and 24 (see FIG. 4) to be mounted internally. That is, the FPC board 31 is drawn from the drawing-out ports 16 and 26, in a shape of an aperture, respectively formed on the lower surface 12b of the upper housing 12 and formed on the upper surface 22a of the lower housing 22 and its folding-back section 31a is positioned between slide facing surfaces, thus allowing the upper unit 11 and lower unit 21 to be slid in a longitudinal direction.

More specifically, in the upper unit 11, a concave space portion 15 is formed through approximately the whole length from a portion near to the tip end side to a portion near to the rear end side in a longitudinal direction of the lower surface 12b of the upper housing 12 bending in a convex shape. The concave space portion 15 is so formed as to have a bottom surface 15a being parallel to the circuit substrate 14 and upper surface 12a and a recessed shape being wider in width than the FPC board 31 and the drawing-out port 16 of the FPC board 31 is formed, in a shape of an aperture, on the rear end side. On the other hand, in the lower unit 21, a concave space portion 25 is formed from a portion near to the rear end side to a portion near to a lowest bottom portion in the proximity of a concave-shaped central portion in the longitudinal direction of the upper surface 22a of the lower housing 22 bending in the concave shape. The concave space portion 25 is so formed as to have a bottom surface 25a being parallel to the circuit substrate 24 and the upper surface 22a and a recessed shape being wider in width than the FPC board 31 and a drawing-out port 26 of the FPC board 31 is formed, in a shape of an aperture, on the tip end side (near the front). That is, the drawing-out port 16 of the upper housing 12 and the drawing-out port 26 of the lower housing 22 are formed on the end portion of the concave space portions 15 and 25 so that the drawing-out ports 16 and 26 are not exposed to the outside even in the case of the state where the upper unit 11 and lower unit 21 overlie each other or even in the case of the state where the upper unit 11 is slid over the lower unit 21 to the maximum. Moreover, the drawing-out port 26 of the lower housing 22 is formed at a place facing the drawing-out port 16 of the upper housing 12 in an opened state where the drawing-out port 26 is slid to the maximum.

On the other hand, on the upper unit 11 side, the FPC board 31 extends, after being drawn from the drawing-out port 16 formed, in a shape of an aperture, on the rear end side of the concave space portion 15 of the upper housing 12, up to the tip end side (up to over a portion near to a central portion) of the concave space portion 25 of the lower housing 22 facing the tip end portion of the concave space portion 15. The FPC board 31 on the lower unit 21 extends, after being drawn out from the drawing-out port 26 formed on the tip end side of the concave space portion 25 of the lower housing 22, up to the rear end side. The FPC board 31 has the folding-back portion 31a which is formed by being extended in the same direction between the tip end side of the concave space portion 15 on the upper unit 11 side and the rear end side of the concave space portion 25 on the lower unit 21 side.

Therefore, as shown in FIG. 4(a), the folding-back portion 31a of the FPC board 31, at the time of the closing state where the upper unit 11 and the lower unit 21 overlie each other, is positioned near to a portion on the rear end portion of the drawing-out port 26 of the concave space portion 25 and is housed in the concave space portions 15 and 25. That is, the FPC board 31 is positioned in most of the area of the concave space portion 15 of the upper housing 12 and, therefore, the folding-back portion 31a bends in a curvature that provides no load and its dimensions are set so that the distance between the bottom surface 15a and lower surface 12b falls within a maximum interval distance L1.

Moreover, at the time of the opened state in which the upper unit 11 is slid over the lower unit 21 at the maximum, the folding-back portion 31a of the FPC board 31, as shown in FIG. 4(b), moves from a portion near to the drawing-out port 26 of the concave space portion 25 toward the rear end side and is housed in the concave space portions 15 and 25. That is, as the drawing-out port 16 of the upper housing 12 is slid over the tip end portion (approaching the drawing-out port 26 of the lower housing 22), the FPC board 31 existing between the drawing-out ports 16 and 26 changes the position where the folding-back portion 31a is formed so as to be positioned on the rear end side in the concave space portion 15 corresponding to a portion near to a central portion of the concave space portion 25 and, therefore, the dimensions are set so as to prevent the exposure toward the outside.

Therefore, at the time of the opened state in which the upper unit 11 is slid over the lower unit 21 to allow the operation section 21a to be exposed, by positioning the FPC board 31 in the concave space portion 15 of the upper housing 12 and in the concave space portion 25 of the lower housing 22, the distance between the bottom surface 15a and lower surface 25b falls within the distance L2 obtained by adding space distance on the concave space portion 25 side to the distance L1 obtained when the upper unit 11 and lower unit 21 overlie each other. Therefore, when the upper unit 11 is slid over the lower unit 21, by changing the shape of the folding-back portion 31a so as to be bent gently in a curvature that provides less load, the connected state between the circuit substrates 14 and 24 can be maintained. Moreover, by using the FPC board 31, the sliding distance falls within the short distance L3 being shorter than a sliding distance L4 of the upper unit 11 and, therefore, a large exposure area on the tip end side of the lower unit 21 can be taken, which makes it possible to ensure a larger area of the operation section 21a.

The FPC board 31 moves the folding-back portion 31a and changes its shape outside the drawing-out ports 16 and 26 of the upper housing 12 or the lower housing 22 (that is, the use of the drawing-out ports 16 and 26 is not required for inputting and outputting) and, therefore, it is made possible to seal portions other than the drawing-out ports 16 and 26 of the upper housing 12 and lower housing 22 or to block the drawing-out ports 16 and 26, which can improve dust resistance.

Thus, according to the first exemplary embodiment, the concave space portions 15 and 25 are formed respectively on the lower surface 12b of the upper housing 12 and on the upper surface 22a of the lower housing 22 both being the slide facing surfaces between the upper unit 11 and lower unit 21 both being relatively slid in a bending direction and, therefore, the folding-back portion 31a of the FPC board 31 can be housed in the above concave space portions 15 and 25. As a result, space among the lower surface 12b, upper surface 22a, and circuit substrates 14 and 24 can be used effectively without producing dead space, which ensures mounting space (distances L1 and L2) required for durability of the FPC board 31 therein without providing another space separately. Thus, in the first exemplary embodiment employing the structure allowing the upper unit 11 to be slid over the lower unit 21 in a slanting direction and allowing miniaturization and thinning of the mobile phone to be achieved, as a result, a user performing operations of the operation section 21a can see visually and easily the display portion 11a.

Second Exemplary Embodiment

Figure 5:
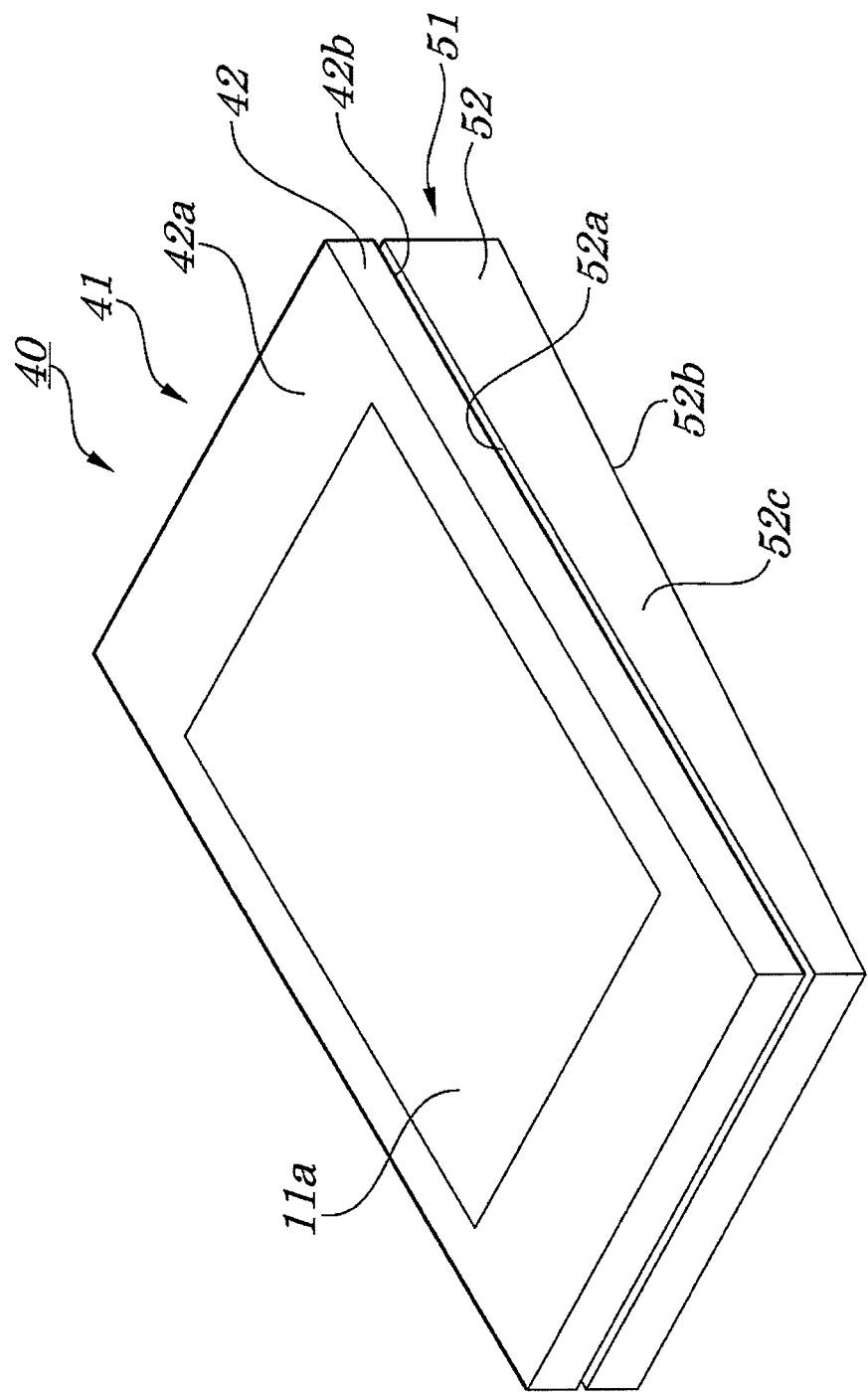
FIG. 5 is a perspective view showing a mobile phone being a portable electronic device having a sliding mechanism of the second exemplary embodiment of the present invention.
Figure 6:
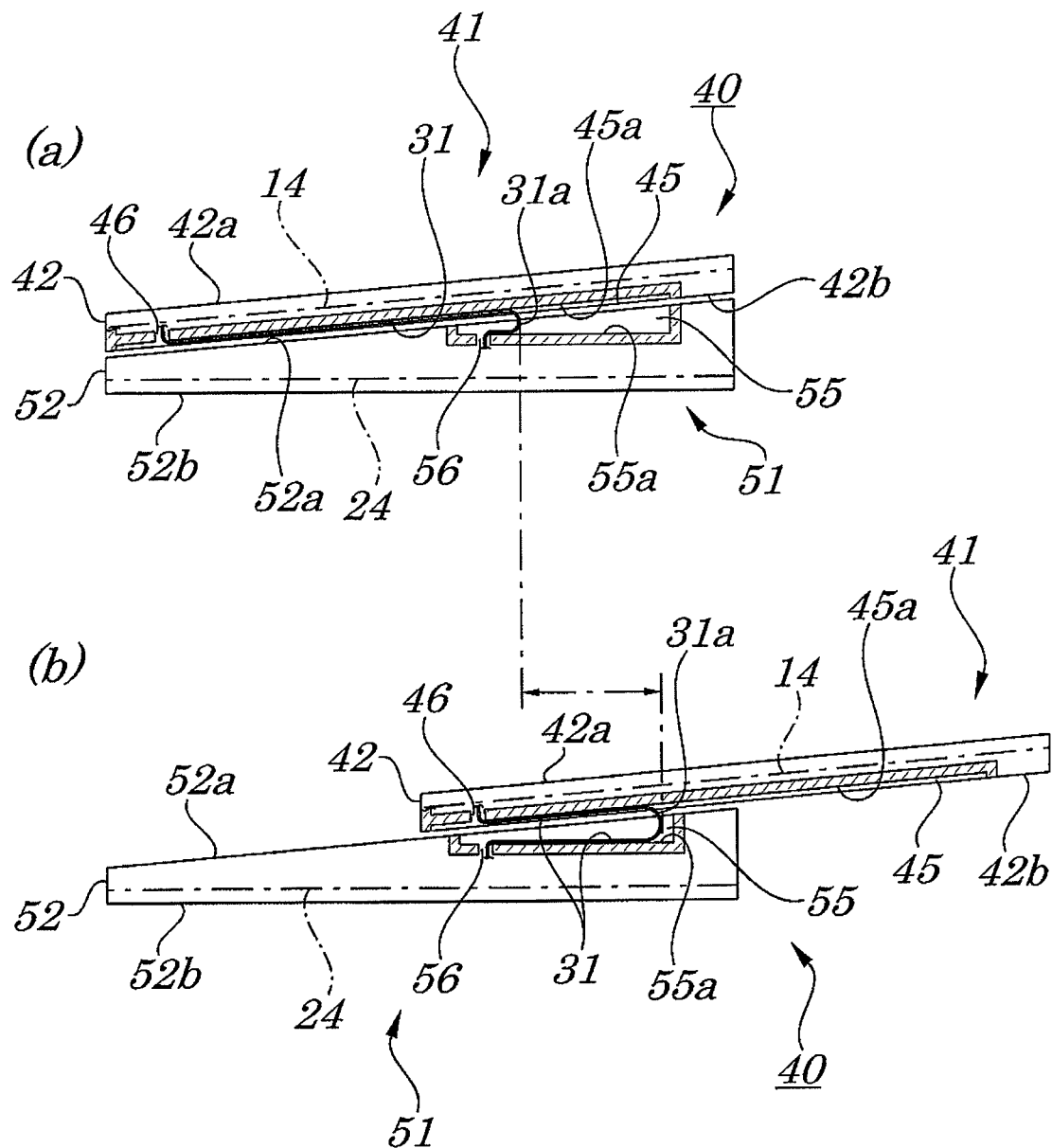
FIG. 6 is a diagram explaining sliding motion of the mobile phone and FIG. 6 (a) is a side perspective view showing a state before the sliding motion and FIG. 6 (b) is a side perspective view showing a state before the sliding motion.

FIGS. 5 and 6 are diagrams showing one example of a mobile phone of a second exemplary embodiment employing a sliding-type electronic device having a mounting structure of an FPC board of the present invention. FIG. 5 is a perspective view showing an outward appearance of the mobile phone. FIG. 6 is a side transparent view showing the FPC board to connect circuit substrates while first and second housings are in a sliding operation. Since the structure of the second exemplary embodiment is the same as the above first exemplary embodiment, in FIGS. 5 and 6, same reference numbers are assigned to same parts (this applies to other exemplary embodiments).

As shown in FIGS. 5 and 6, as in the above first exemplary embodiment, the mobile phone 40 is configured so that an upper unit 41 is coupled to a lower unit 51 by an FPC board 31 and that the upper and lower units 41 and 51 can overlie each other in a manner in which the upper surface of the mobile phone 40 is inclined in a thin box-like structure. The mobile phone 40 is also configured so that the upper unit 41 faces the lower unit 51 and a lower surface 42b of an upper housing 42 of the upper unit 41 can be coupled to an upper surface 52a of a lower housing 52 of the lower unit 51 in a manner in which a lower surface 52b and an upper surface 42a can be freely slid in a longitudinal direction with the two surfaces 42b and 52a facing each other. In the upper unit 41, a display portion 11a to display various information is disposed on approximately the whole upper surface 42a of the upper housing 42. In the lower unit 51, an operation section (not shown) to perform an operation to input various information is disposed in a region on the upper surface 52a of the lower housing 52 exposing after having slid the upper unit 41.

The height of the side surface (side wall portion) 52c of the lower housing 52 of the lower unit 51 changes along the slant-inclined upper surface 52a rising toward the rear end side. The upper surface 42a and lower surface 42b of the upper housing 42 of the upper unit 41 are slant-inclined in parallel to the upper surface 52a of the lower housing 52 and the lower surface 42b of the upper housing 42 faces the upper surface 52a of the lower housing 52 in a state being in close contact with each other. On the lower surface 42b of the upper housing 42 and on the upper surface 52a of the lower housing 52, as in the above first exemplary embodiment, grooved rails each having its cross-sectional shape of a key-shaped track and extruding rails are formed and the lower surface 42a and upper surface 52a can be slid, in a state in which the lower and upper surfaces face each other, relatively in a longitudinal direction (in a slanting direction). That is, when the upper unit 41 and lower unit 51 are slid relatively from a closed state where the units 41 and 51 overlie each other to an opened state, the operation section on the upper surface 52a of the lower housing 52 can be exposed so as to be operable for inputting from a state being hidden against the lower surface 42b of the upper housing 42. Moreover, a face angle at the display portion 11a facing a user can be made larger which can improve visibility, compared when the display portion 11a on the upper housing 42 is slid in a horizontal direction.

In the upper unit 41, a concave space portion 45 is formed through approximately the whole length from a portion near to the tip end side to a portion near to the rear end side in a longitudinal direction of the lower surface 42b of the upper housing 42 bending in a concave shape. The concave space portion 45 is so formed as to have a bottom surface 45a being parallel to a circuit substrate 14 and the upper surface 42a and a recessed shape having a depth enough to house the FPC board 31 and a drawing-out port 46 of the FPC board 31 is formed, in a shape of an aperture, on the rear end side. On the other hand, in the lower unit 51, a concave space portion 55 is formed from a portion near to the rear end side to the central portion in a longitudinal direction of the upper surface 52a of the lower housing 52. The concave space portion 55 is so formed as to have some depth on its tip end portion and have a bottom surface 55a being parallel to a circuit substrate 24 and the lower surface 52b and a recessed shape being wider in width than the FPC board 31 and a drawing-out port 56 of the FPC board 31 is formed, in a shape of an aperture, on the tip end side (front side). That is, even in the case of the closed state where the upper unit 41 and lower unit 51 overlie each other or even in the case of the opened state where the upper unit 41 is slid over the lower unit 51 to the maximum, the drawing-out port 46 of the upper housing 42 and the drawing-out port 56 of the lower housing 52 are formed in end portions of the concave space portions 45 and 55 so that the drawing-out ports 46 and 56 are not exposed to the outside. Moreover, when the upper unit 41 is slid over the lower unit 51 to the maximum, the drawing-out port 56 of the lower housing 52 and the drawing-out port 46 of the upper housing 42 are so formed as to face each other.

On the other hand, the FPC board 31, on the upper unit 41 side, after being drawn from the drawing-out port 46 formed on the rear end side of the concave space portion 45 of the upper housing 42, extends up to the tip end side (up to a portion near to a central position) of the concave space portion 55 of the lower housing 52 facing on the tip end side of the concave space portion 45. The FPC board 31 on the lower unit 51, after being drawn from the drawing-out port 56 formed on the tip end side of the concave space portion 55 of the lower housing 52, extends up to the end side. Then, the FPC board 31 extends in the same direction on the tip end side of the concave space portion 45 on the upper unit 41 side and on the rear end side of the concave space portion 55 of the lower unit 51 side to be folded back so that a folding-back portion 31a is formed.

Therefore, the FPC board 31, as shown in FIG. 6(*a*), in the case of the closed state where the upper unit 41 and lower unit 51 overlie each other, the folding-back portion 31*a* is positioned in a portion near to the rear end side of the drawing-out port 56 of the concave space portion 55 and is to be housed in the concave space portion 55. That is, the folding-back portion 31*a* is positioned in a portion near to the rear end side of the concave space portion 55 and, therefore, by forming the concave space portion 55 so as to be deeper from its tip end side than the case of the above exemplary embodiment, the folding-back portion 31*a* is allowed to bend in a curvature that provides no load and its dimensions are so set as to be housed therein.

In the case of the opened state where the upper unit 41 is slid over the lower unit 51 to the maximum, the folding-back portion 31*a* of the FPC board 31, as shown in FIG. 6(*b*), moves toward the rear end side from a portion near to the drawing-out port 56 of the concave space portion 55 to be housed in its concave space portion 56. That is, as the drawing-out port 46 of the upper housing 42 slides toward the tip end portion (approaching the drawing-out port 56 of the lower housing 52), the FPC board 31 between the drawing-out ports 46 and 56 changes a position where the folding-back portion 31*a* is formed so as to be positioned on the rear end side in the concave space portion 55 being deepest from the slant-inclined upper surface 52*a* and, therefore, the folding-back portion 31*a* is allowed to bend in a curvature that provides no load and its dimensions are so set as not to be exposed outside.

Thus, according to the second exemplary embodiment, the folding-back portion 31*a* of the FPC board 31 can be housed in the concave space portion 55 formed in the upper surface 52*a* serving as a slide facing surface of the lower housing 52 on the lower unit 51 side allowing the upper unit 41 to slide relatively in a slanting direction. As a result, space among the upper surface 52*a* and circuit substrates 24 can be used effectively without producing dead space, which ensures mounting space required for durability of the FPC board 31 therein without providing another space separately. Thus, in the second exemplary embodiment employing the structure allowing the upper unit 41 to be slid over the lower unit 51 in a slanting direction and, by preventing unnecessary large thickness of components, miniaturization and thinning can be achieved and, as a result, a user performing operations of the operation section 21*a* can see visually and easily the display portion 11*a*.

Third Exemplary Embodiment

Figure 7:
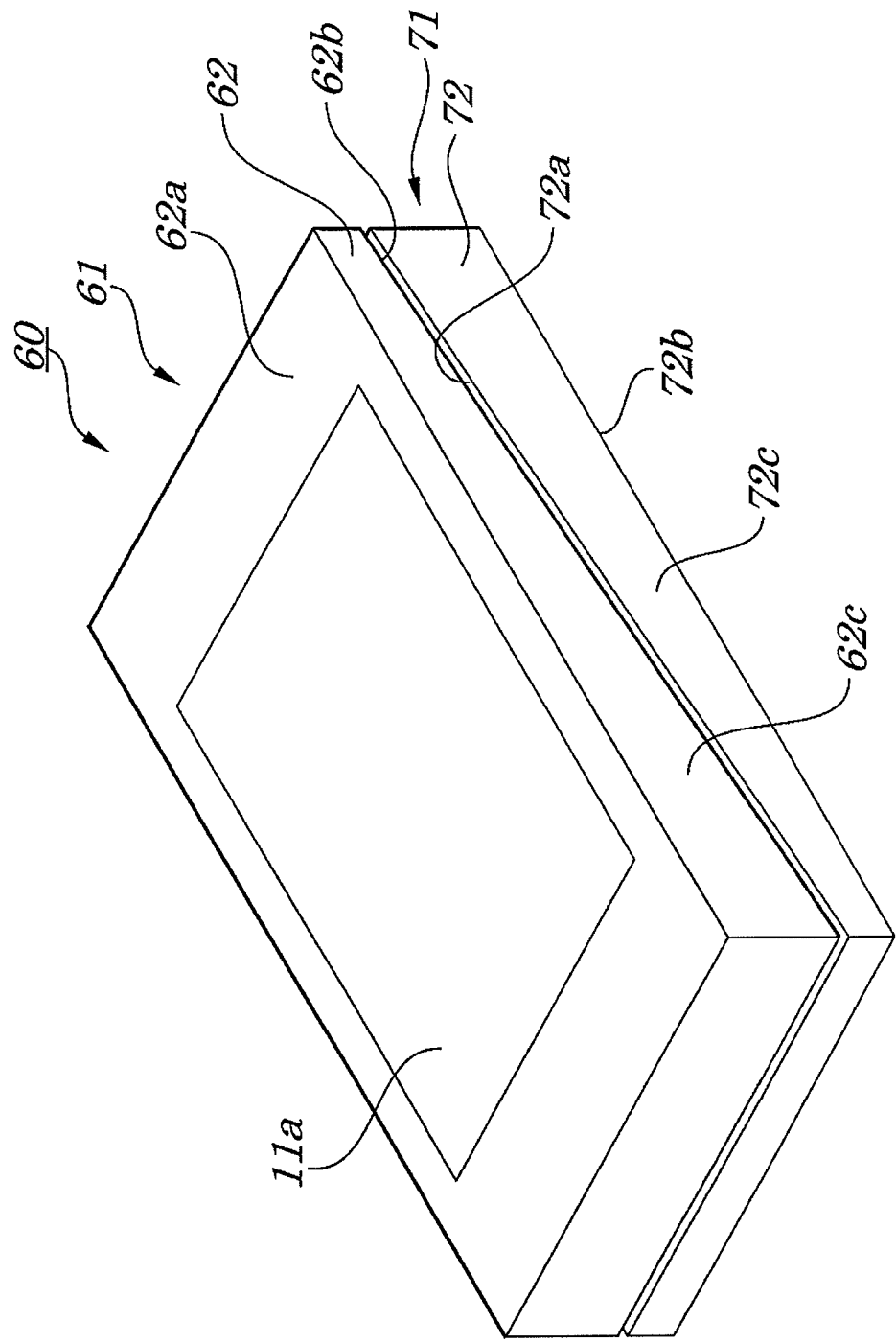
FIG. 7 is a perspective view showing a mobile phone being a portable electronic device having a sliding mechanism of the third exemplary embodiment of the present invention.
Figure 8:
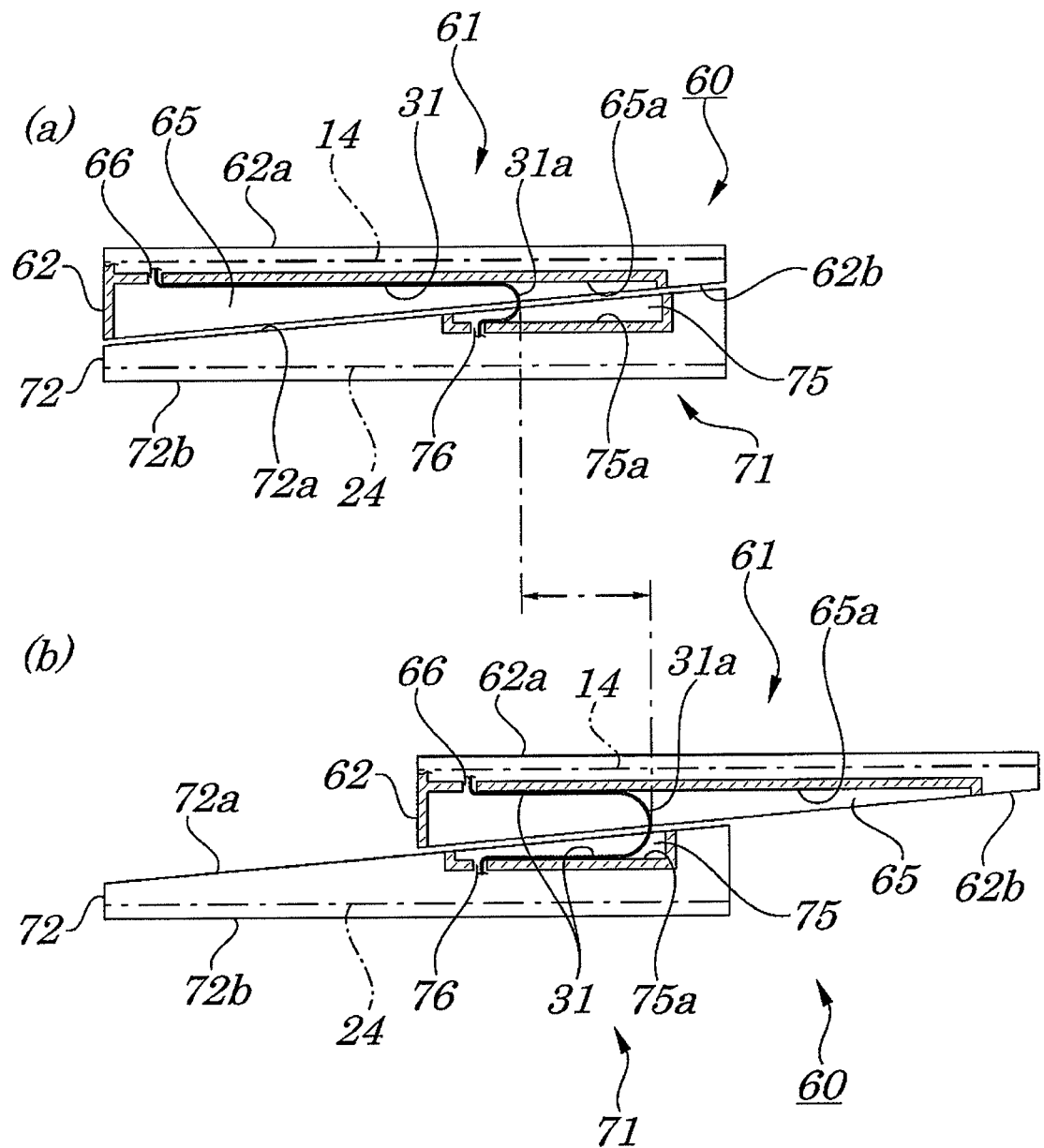
Figure 9:
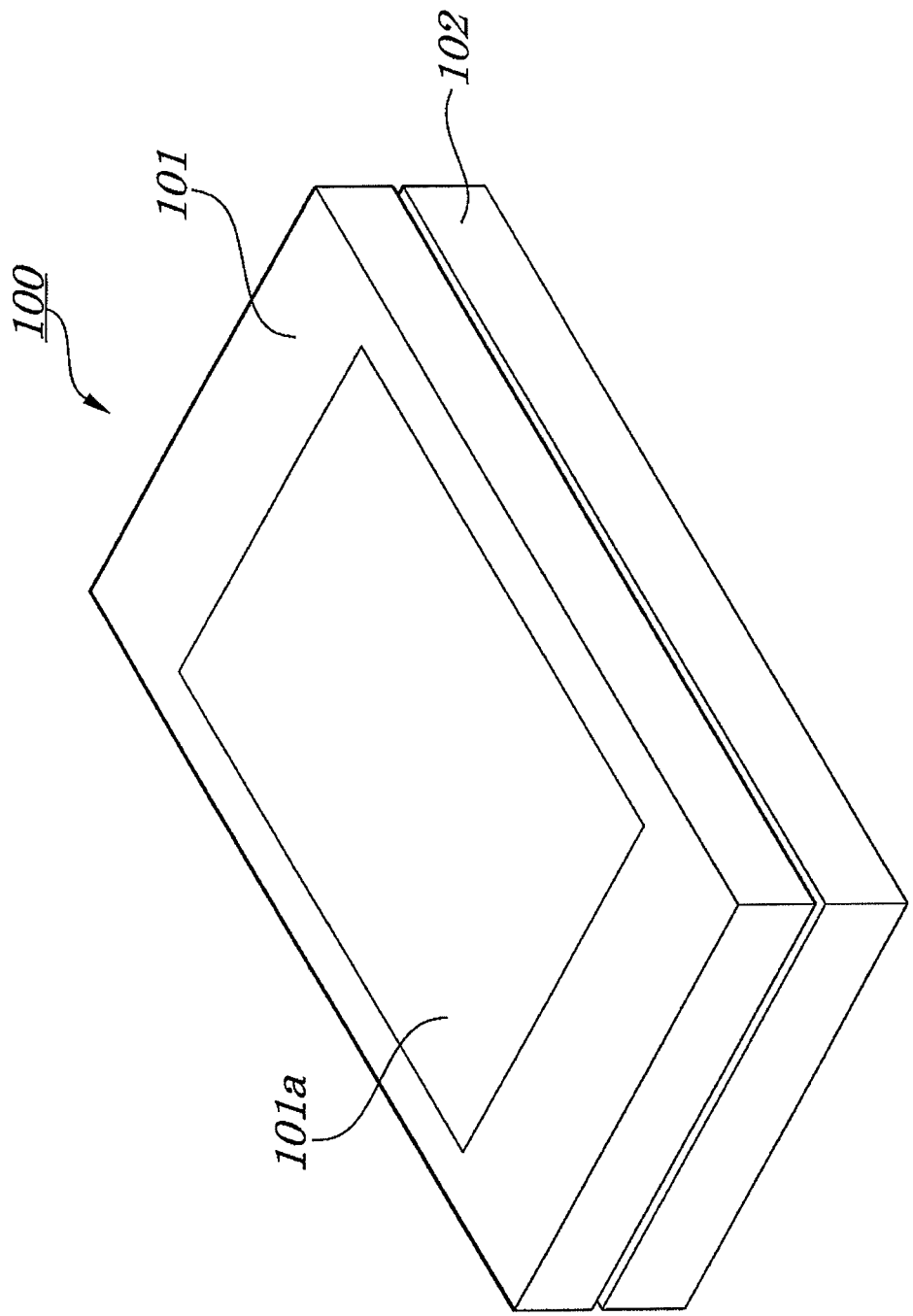
FIG. 9 is a perspective view showing a mobile phone having a sliding mechanism of the related technologies.
Figure 10:
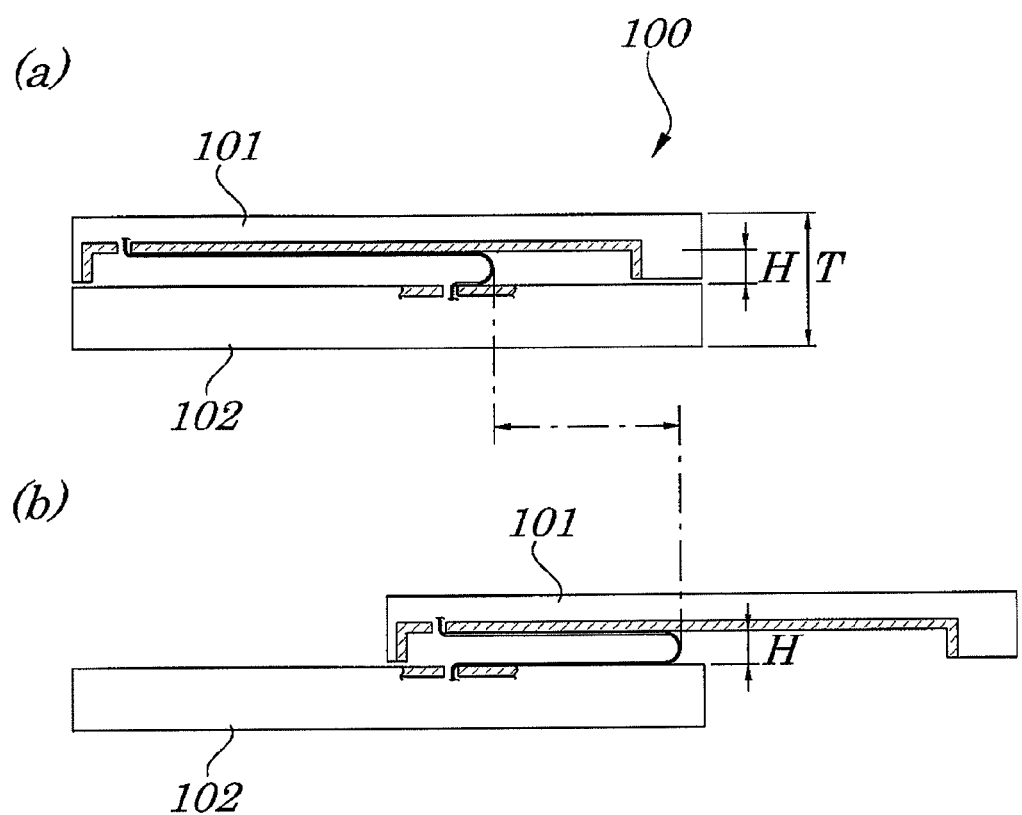

FIGS. 7 and 8 are diagrams showing one example of a mobile phone of a third exemplary embodiment employing a sliding-type electronic device having a mounting structure of a flexible printed circuit of the present invention. FIG. 7 is a perspective view showing an outward appearance of the mobile phone. FIG. 8 is a side transparent view showing an FPC board to connect circuit substrates while upper and lower housings are in a sliding operation.

As shown in FIGS. 7 and 8, the mobile phone 60 is so configured that an upper unit 61 and a lower unit 71 are coupled by the FPC board 31 in a manner in which the upper and lower units 61 and 71 can overlie each other in the shape of thin rectangular parallelepiped structure and in a manner in which a lower surface 62*b* of the upper housing 62 of the upper unit 61 and an upper surface 72*a* of the lower housing 72 of the lower unit 71 can be freely slid in a longitudinal direction with the lower surface 62*b* and upper surface 72*a* being faced towards each other. A display portion 11*a* to display various information is placed on approximately the whole upper surface 62*a* of the upper housing 62. In the lower unit 71, an operation section (not shown) to perform an operation to input various information is disposed in a region on the upper surface 72*a* of the lower housing 72 exposing after having slid the upper unit 61.

In the lower unit 71, the height of a side surface (side wall portion) 72*c* of the lower housing 72 changes slant in a sliding direction and the upper surface 72*a* becomes higher on the rear end side in a slanted manner. In the upper unit 61, similarly, the height of a side surface (side wall portion) 62*c* of the upper housing 62 changes slant in a sliding direction and the lower surface 62*b* becomes lower on the rear end side in a slanted manner. The lower surface 62*b* faces the upper surface 72*a* in a manner approaching each other. On the lower surface 62*b* of the upper housing 62 and on the upper surface 72*a* of the lower housing 72, as in the above exemplary embodiments, grooved rails each having its cross-sectional shape of a key-shaped track and extruding rails are formed and the lower surface 62*b* and upper surface 72*a* can be slid, in a state in which the lower and upper surfaces face each other in an approaching manner, relatively in a longitudinal direction (in a slanting direction). That is, when the upper unit 61 and lower unit 71 are slid relatively from a closed state where the units 61 and 71 overlie each other to an opened state, the operation section on the upper surface 72*a* of the lower housing 72 can be exposed so as to be operable for inputting from a state being hidden against the lower surface 62*b* of the upper housing 62.

In the upper unit 61, a concave space portion 65 is formed through approximately the whole length from a portion near to the tip end side to a portion near to the rear end side in a longitudinal direction of the lower surface 62*b* of the upper housing 62. The concave space portion 65 is so formed as to have a bottom surface 65*a* being parallel to a circuit substrate 14 and the upper surface 62*a* and a recessed shape being wider in width than the FPC board 31 and a drawing-out port 66 of the FPC board 31 is formed, in a shape of an aperture, on the rear end side. On the other hand, in the lower unit 71, a concave space portion 75 is formed from a portion near to the rear end side to a portion near to a central position in the longitudinal direction of the upper surface 72*a* of the lower housing 72. The concave space portion 75 is so formed as to have a bottom surface 75*a* being parallel to the circuit substrate 14 and upper surface 72*a* and a recessed shape being wider in width than the FPC board 31 and a drawing-out port 76 of the FPC board 31 is formed, in a shape of an aperture, on the tip end side (near the front). That is, the drawing-out port 66 of the upper housing 62 and the drawing-out port 76 of the lower housing 72 are formed on the end portion of the concave space portions 65 and 75 so that the ports 66 and 76 are not exposed to the outside even in the case of the state where the upper unit 61 and lower unit 71 overlie each other or even in the case of the state where the upper unit 61 is slid over the lower unit 71 to the maximum. Moreover, the drawing-out port 76 of the lower housing 72 is formed at a place facing the drawing-out port 66 of the upper housing 62 in an opened state where the drawing-out port 76 is slid to the maximum.

On the other hand, on the upper unit 61 side, the FPC board 31 extends, after being drawn from the drawing-out port 66 formed, in a shape of an aperture, on the rear end side of the concave space portion 65 of the upper housing 62, up to the tip end side (up to over a portion near to a central portion) of the concave space portion 75 of the lower housing 72 facing the tip end portion of the concave space portion 75. The FPC board 31 on the lower unit 71 side extends, after being drawn from the drawing-out port 76 formed on the tip end side of the concave space portion 75 of the lower housing 72, up to the rear end side (over a portion near to a central portion). The FPC board 31 has a folding-back portion 31a which is formed by being extended in the same direction between the tip end side of the concave space portion 65 on the upper unit 61 side and the rear end side of the concave space portion 75 on the lower unit 71 side.

Therefore, in the case of the closed state wherein the upper unit 61 and lower unit 71 overlie each other, the folding-back portion 31a of the FPC board 31, as shown in FIG. 8(a), is positioned in a portion near to the rear end side of the drawing-out port 76 of the concave space portion 75 and is housed in the concave space portions 65 and 75. That is, the folding-back portion 31a of the FPC board 31 is positioned at a place having an intermediate depth in the concave space portion 65 and is allowed to bend in a curvature that provides no load and its dimensions are so set as to be housed therein.

Moreover, in the case of the opened state where the upper unit 61 is slid over the lower unit 71 to the maximum, the folding-back portion 31a of the FPC board 31, as shown in FIG. 8(b), moves from a portion near to the drawing-out port 76 of the concave space portion 75 to the rear end side and is housed in the concave space portions 65 and 75. That is, as the drawing-out port 66 of the upper housing 62 is slid toward the tip end portion side (approaching the drawing-out port 76 of the lower housing 72), the FPC board 31 existing between the drawing-out ports 66 and 76 changes the position where the folding-back portion 31a is formed so as to be positioned on the deepest rear end side in the concave space portion 75 and to gently bend in a curvature that provides small load and, therefore, the dimensions are set so as to prevent the exposure toward the outside.

Thus, according to the third exemplary embodiment, the upper unit 61 and lower unit 71 are slid relatively in a slanting direction and the lower surface 62b of the upper housing 62 faces the upper surface 72a of the lower housing 72 and the concave space portion 65 is formed on the lower surface 62a of the upper housing 62 and the concave space portion 75 is formed on the upper surface 72a of the lower housing 72. As a result, space among the lower surface 62b, upper surface 72a, and circuit substrates 14 and 24 can be used effectively without producing dead space, which ensures mounting space required for durability of the FPC board 31 therein without providing another mounting space separately. Thus, in the third exemplary embodiment employing the structure allowing the upper unit 61 to be slid over the lower unit 71 in a slanting direction and, by preventing unnecessary large thickness of components, which can achieve miniaturization and thinning of the mobile phone.

Though various exemplary embodiments have been described in detail with reference to the figures, it is understood that the invention is not limited to these exemplary embodiments but may be changed and modified without departing from the scope of the invention. In the exemplary embodiments described above, examples are explained in which concave space portions to house the FPC board are formed on both the upper housing and lower housing facing each other in a manner in which each housing has more than a depth corresponding to a thickness of the FPC board, however, it is not necessary to say that the present invention is not limited to these and, when required space can be ensured, the concave space portion can be formed in one housing only. For example, in the above second exemplary embodiment, in the second exemplary embodiment, the concave space portion 45 may not have its depth.

In the above exemplary embodiments, one example is described in which the upper housing is slid over the lower housing in a longitudinal direction, however, the present invention is not limited to this and, for example, even when the housings are relatively moved rotationally in a positive or negative direction by using its one end portion as rotational-motion supporting point, the present invention can be applied to the case where a surface moving rotationally in a positive or negative direction is inclined.

The present application claims priority based on Japanese Patent Application No. 2008-299082 filed Nov. 25, 2008, the entire contents of which are incorporated herein by reference in its entirely.

Industrial Applicability

The present invention can be widely applied not only to mobile phones but also electronic devices having a sliding mechanism, for example, portable electronic terminals such as notebook type personal computer, PDAs (personal digital assistants), digital cameras, and digital video cameras.

EXPLANATION OF LETTERS AND NUMERALS 10, 40, and 60; Mobile phone (portable electronic device)
11a; Display portion
12, 42, and 62; Upper housing (first housing)
12b, 42b, and 62b; Lower surface (Slide facing surface)
12c, 22c, 52c, 62c, and 72c; Side surface (side wall portion)
13; Grooved rail
14 and 24; Circuit substrate
15, 25, 45, 55, 65, and 75; Concave space portion
16, 26, 46, 56, 66, 76; Drawing-out port
21a; Operation section
22, 52, and 72; Lower housing (second housing)
22a, 52a, and 72a; Upper surface (slide facing surface)
23; Extruding rail
31; Flexible printed circuit (FPC) board
31a; Folding-back portion

What is claimed is:

1. A sliding-type electronic device comprising:
  a flexible printed circuit board folded back and routed between slide facing surfaces of a first housing and a second housing both being mechanically coupled to each other in a manner being freely slidable to electrically connect said first and second housings wherein a height of a sidewall surface making up at least one of said first and second housings changes in a bending manner along a freely slidable direction;
  a concave space portion on one slide facing surface making up at least one of said first and second housings to accommodate flexible changes in folding-back curvature and folding-back position of said flexible printed circuit board caused by sliding motion between said first and second housings; and
  first and second drawing-out ports to draw out said flexible printed circuit board between said slide facing surfaces of said first and second housings, in such a manner that the drawn-out flexible printed circuit board is housed in a facing region even when said slide facing surfaces are in a maximum opened sliding state,
  wherein said first drawing-out port is formed, within said concave space portion, in a rear end portion in a direction of sliding open motion on said one slide facing surface, and said second drawing-out port is formed in a front portion opposite said rear end portion in a direction of sliding open motion on another slide facing surface which faces said one side facing surface.

2. The sliding-type electronic device according to claim 1, wherein said concave space portion is extended at least up to a central portion from a rear end portion in a direction of sliding open motion on a sliding facing surface of said first housing, and wherein said second drawing-out port is formed, in a shape of an aperture, in a position facing said first drawing-out port in a maximum open sliding state.

3. A mounting structure of a flexible printed circuit board comprising:

a flexible printed circuit board folded back and routed between slide facing surfaces of a first housing and a second housing both being mechanically coupled to each other in a manner being freely slidable to electrically connect said first and second housings wherein a height of a sidewall surface making up at least one of said first and second housings changes in a bending manner along a freely slidable direction;

a concave space portion on one slide facing surface making up at least one of said first and second housings to accommodate flexible changes in folding-back curvature and folding-back position of said flexible printed circuit board caused by sliding motion between said first and second housings; and first and second drawing-out ports to draw out said flexible printed circuit board between said slide facing surfaces of said first and second housings, in such a manner that the drawn-out flexible printed circuit board is housed in a facing region even when said slide facing surfaces are in a maximum opened sliding state, wherein said first drawing-out port is formed, within said concave space portion, in a rear end portion in a direction of sliding open motion on said one slide facing surface, and said second drawing-out port is formed in a front portion opposite said rear end portion in a direction of sliding open motion on another slide facing surface which faces said one side facing surface.

4. The mounting structure of the flexible printed circuit board according to claim 3, wherein said concave space portion is extended at least up to a central portion from a rear end portion in a direction of sliding open motion on a sliding facing surface of said first housing, and wherein said second drawing-out port is formed, in a shape of an aperture, in a position facing said first drawing-out port in a maximum open sliding state.

* * * * *